United States Patent [19]
Ben Oren et al.

[11] Patent Number: 5,969,872
[45] Date of Patent: Oct. 19, 1999

[54] SPATIAL LIGHT MODULATOR ILLUMINATION SYSTEM

[75] Inventors: Ilan Ben Oren, Jerusalem; Josef Ronen, Herzlia; Serge Steinblatt, Ra'anana; Amir Komem, Tel Aviv, all of Israel

[73] Assignee: Scitex Corporation Ltd., Herzlia, Israel

[21] Appl. No.: 09/231,016

[22] Filed: Jan. 11, 1999

Related U.S. Application Data

[62] Division of application No. 08/838,080, Apr. 15, 1997, Pat. No. 5,900,981.

[51] Int. Cl.$^6$ ..................................................... G02B 27/10
[52] U.S. Cl. ............................................................. 359/621
[58] Field of Search ..................................... 359/618, 619, 359/621, 622, 623, 624, 626

[56] References Cited

U.S. PATENT DOCUMENTS

| | | | |
|---|---|---|---|
| 5,049,901 | 9/1991 | Gelbart | 108/346 |
| 5,132,723 | 7/1992 | Gelbart | 40/355 |
| 5,333,077 | 7/1994 | Legar et al. | 619/359 |
| 5,420,722 | 5/1995 | Bielak | 708/359 |
| 5,448,395 | 9/1995 | Lopez et al. | 359/224 |
| 5,465,175 | 11/1995 | Woodgate et al. | 359/463 |
| 5,517,359 | 5/1996 | Gelbart | 623/359 |
| 5,521,748 | 5/1996 | Sarraf | 359/321 |
| 5,729,386 | 3/1998 | Hwang | 359/618 |
| 5,748,374 | 5/1998 | Neijzen et al. | 359/621 |

OTHER PUBLICATIONS

James R. Legar et al.; "Geometrical Transformation of Linear Diode–Laser Array for Longitudinal Pumping of Solid–Stato Lasers"; IEEE Journal of Quantum Electronics, Vol. 28, No. 4., Apr. 1992., pp. 1088–1100.

Dan Gelbart; "High Power Multi–Channel Writing Heads", IS&T's Tenth Intl. Congress on Advances in Non Impact Printing Tech., pp. 337–339, 1994.

Primary Examiner—Georgia Epps
Assistant Examiner—Ricky Mack
Attorney, Agent, or Firm—Darby & Darby

[57] ABSTRACT

A novel optical system operative to transfer, with high efficiency, optical power from a line source, such as a LDB, built from a plurality of individual light sources with different angular distribution in two orthogonal axis into a rectangular area with a particular aspect ratio and two different numerical apertures. The near field pattern of a LDB is imaged onto the plane of an SLM. The system utilizes light generated from an LDB having a plurality of individual light sources to illuminate a microlens array. The microlens array, consisting of a plurality of microlenses, functions to collimate the light from the LDB in the slow axis. An optical element adjacent the microlens array refracts the light in the fast axis. In the slow axis, the light from the microlens array is incident upon an optical element which focuses the light onto the SLM plane such that the light from each point light source illuminates the entire active pixel area of the SLM. An additional optical element focuses the light in the fast axis to generate the required spot image. The optical system of the present invention utilizes natural aberrations and/or artificial aberrations to decrease the sensitivity of the optical system to the smile phenomena exhibited by most laser diode bars.

16 Claims, 13 Drawing Sheets

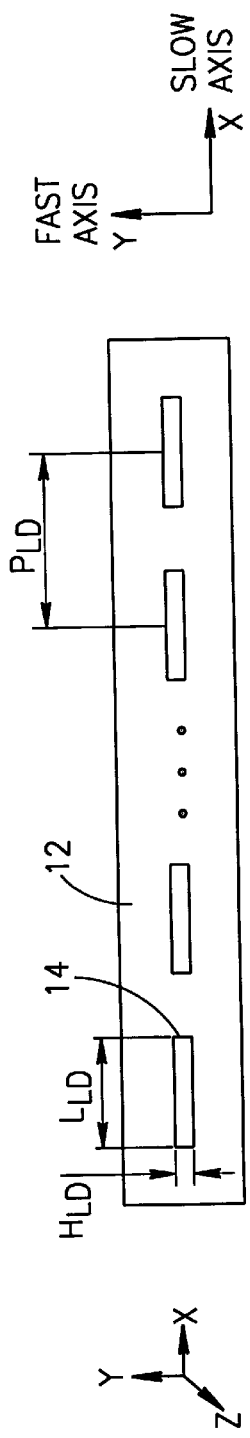
FIG.1A
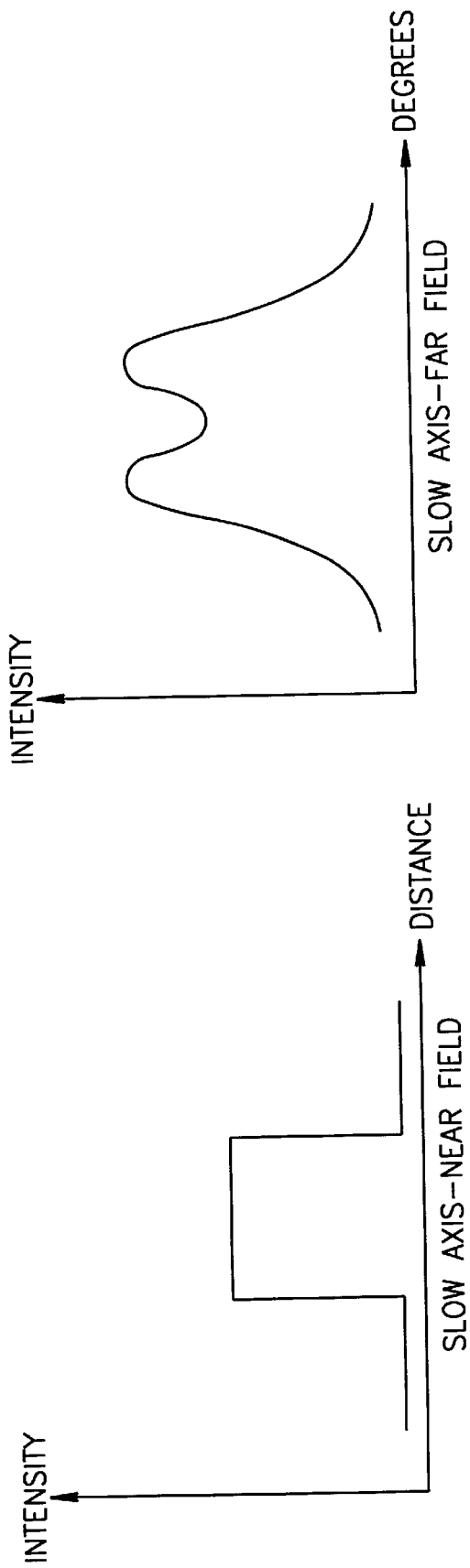
FIG.1C
FIG.1B

SPATIAL LIGHT MODULATOR ILLUMINATION SYSTEM

This is a division of application Ser. No. 08/838,080, filed Apr. 15, 1997 now U.S. Pat. No. 5,900,981.

FIELD OF THE INVENTION

The present invention relates generally to optical systems and more particularly relates to an optical system for illuminating a spatial light modulator (SLM).

BACKGROUND OF THE INVENTION

Optical printing head systems are known in the art and are currently being used in a variety of applications. One way of constructing optical printing head systems is to use one or more high power laser diode bars (LDB) or laser diode arrays (LDA). However, the optical printing head systems in current use suffer from several disadvantages, discussed below.

A schematic diagram illustrating a conventional laser diode bar (LDB) is shown in FIG. 1A. The LDB 12 houses a plurality of individual laser diode elements 14. For example, each laser diode element has a length $L_{LD}$ of approximately 50 to 150 microns (50 microns is shown in the Figure), a height $H_{LD}$ of approximately 1 micron and a pitch $P_{LD}$ of approximately 120 to 600 microns. The y-axis perpendicular to the length of the LDB is termed the fast axis and the x-axis parallel to the length of the LDB is termed the slow axis. The orientation of the LDB is further defined by the XYZ axis shown to the left of the LDB in FIG. 1A.

The near field image of the light source in the slow axis is illustrated in FIG. 1B. The image is plotted as the intensity versus spatial aperture coordinates. The near field extends up to approximately a few millimeters from the lens. As is apparent from the Figure, near field image in the slow axis has a top hat shape. However, after a few millimeters, the far field loses its top hat shape. The far field image of the light source in the slow axis is illustrated in FIG. 1C which is a plot of energy distribution or intensity versus angular scale for a each of the emitters. The far field illumination in the slow axis at the SLM plane has an undesirable depression that causes the SLM to be illuminated non uniformly.

A prior art spatial light modulator illumination system imaging the far field of the LDB source is shown in FIG. 2A. A linear array laser diode bar (LDB) source 12 comprises a plurality of individual elements represented by rectangles 14. Light emitted from these elements is directed to optical element 16 which may be a cylindrical lens. If lens 16 is placed at a focal length distance from the light source 12, as indicated by the distance 'f', the output of the lens 16 will be a set of collimated beams that overlap in the front focal plane. The output of the lens is incident onto a spatial light modulator (SLM) 18 placed at the focal length 'f' of the optical element 16 as indicated in the Figure. The SLM 18 comprises a linear array of elements 20. The SLM functions to turn each individual pixel to be illuminated on and off in accordance with the pattern to be imaged.

Using a linear diode array bar to illuminate an SLM, however, suffers from several disadvantages due to the laser's poor emission characteristics. The most noticeable is the well known 'smile' affect caused by misalignment of the individual laser diode elements with each other causing some of the elements to lie off axis, thus resembling a smile. This off axis element causes a significant deterioration of optical performance. As an example, the width of a typical laser diode element is approximately 1 micron. An off axis laser diode element may be off as much as 10 micrometers. This results in an error distance of a few tens of micrometers at the SLM, which is large enough such that the light totally misses the active portion of the SLM 20. This error is due to the fact that the light from the laser diode element is magnified in order to cover the bigger pixel area of an SLM.

A major disadvantage of the optical system of FIG. 2 is the large numerical aperture (NA) in the SLM plane 18. This high NA may cause optical crosstalk between adjacent pixels thus decreasing the functional depth of focus of the SLM image.

With reference to FIGS. 1, 2A and 2B, the following example illustrates the disadvantages and limitations of prior art optical illumination systems in connection with the NA. From FIG. 2A the following expression for $\theta_{OUT}$ is derived from first order optics principles and trigonometry.

$$\tan\theta_{IN} = \frac{L_{SLM}}{2 \cdot f}$$

$$\tan\theta_{OUT} = \frac{N \cdot P_{LD}}{2 \cdot f}$$

dividing both side by $\tan(\theta_{OUT})$ results in $$\frac{\tan\theta_{IN}}{\tan\theta_{OUT}} = \frac{L_{SLM}}{N \cdot P_{LD}}$$

$$\tan(\theta_{OUT}) = \frac{N \cdot P_{LD}}{L_{SLM}} \cdot \tan(\theta_{IN})$$

where

N: is the number of individual elements in the laser diode bar $P_{LD}$: is the pitch distance between two laser emitter elements $\theta_{IN}$: is half the angular opening of each element of the SLM in the slow axis Since the angles involved in this example are fairly high, e.g., greater than 10 degrees, the assumption $$\theta \approx \tan(\theta)$$

cannot be made.

We would like to calculate the maximum depth $D_{SLM}$ for the SLM using the prior art optical system of FIG. 2A. With reference to FIG. 2B we can state that $$\tan(\theta_{OUT}) < \frac{G_{SLM}}{D_{SLM}}$$

For the light to pass through the SLM without crosstalk, for a given $D_{SLM}$ and $\theta_{OUT}$, the depth of the SLM cannot be greater than a certain amount. This equation can be rewritten as $$D_{SLM} < \frac{G_{SLM}}{\tan(\theta_{OUT})} = \frac{G_{SLM} \cdot L_{SLM}}{N \cdot P_{LD} \cdot \tan(\theta_{IN})}$$

In this example, the following parameters are given:

$NP_{LD}$=10 mm $G_{SLM}$=6 microns $\theta_{IN}$=12 degrees $L_{SLM}$=4 mm

Substituting these quantities into the equation above yields $$D_{SLM} < \frac{(6 \times 10^{-6})(4 \times 10^{-3})}{(10^{-2})(0.2126)} \approx 11 \text{ microns}$$

Thus, the maximum useable depth of the SLM in this case is 11 microns. This number is not practical as typical SLMs have a depth six or seven times this length. To achieve a low NA, the focal length of the optical element 16 is made as large as possible. A large focal length, however, makes it more difficult to capture the light from the laser diode emitters. As the angle $\theta_{OUT}$ decreases, the NA decreases and SLMs with more depth can be utilized. Thus, this example, highlights why optical systems such as the one of FIG. 2A are impractical to be used to illuminate SLMs.

Another major disadvantage of the optical system of FIG. 2A is that the far field pattern of the LDB is illuminated onto SLM rather than the near field. This is not desirable because the illumination is not uniform, exhibiting a hat profile having a deep depression at the top of the hat, similar to that shown in FIG. 1C.

Optical systems for transforming the output of a laser diode array are known in the art. The paper titled Geometrical Transformation of Linear Diode-laser Arrays for Longitudinal Pumping of Solid-State Lasers, by James R. Leger and William C. Goltsos, IEEE Journal on Quantum Electronics, Volume 28, 1992, pages 1088 to 1100, discloses an optical system for geometrically transforming a linear laser diode array into a two dimensional, symmetric virtual source with symmetrical divergence. Application of the system to SLM is not disclosed.

U.S. Pat. No. 5,333,077, issued to Legar et al., teaches a lens system for use with a single light beam having a spatial cross sectional distribution which is extended predominately in one direction. In addition, the invention can be applied to a linear array of light beams with each individual light beam being directed to different locations on an imaginary plane by a first optical element wherein at least two portions of each individual light beam are directed along two non parallel paths so as to generate a two dimensional pattern of light on the imaginary plane. A second optical element located at the imaginary plane and aligned with the two dimensional pattern of light redirects each portion of the two dimensional pattern of light to a focal point.

In addition, the paper entitled High Power Multi-Channel Writing Heads, by Dan Gelbart, discloses several schemes for multi-channel high powered writing heads for processless materials. Several schemes highlighted include contiguous, segmented, interleaved, slanted and two dimensional array techniques.

SUMMARY OF THE INVENTION

The present invention overcomes the limitations and disadvantages of the prior art by providing an optical system operative to transfer, with high efficiency, optical power from a line source, such as a LDB, built from a plurality of individual light sources with different angular distribution in two orthogonal axis into a rectangular area with a particular aspect ratio and two different numerical apertures. The near field pattern of a LDB is imaged onto the plane of an SLM. The system utilizes light generated from an LDB having a plurality of individual light sources to illuminate a microlens array. The microlens array, consisting of a plurality of microlenses, functions to collimate the light from the LDB in the slow axis. An optical element adjacent the microlens array redirects the light in the fast axis. In the slow axis, the light from the microlens array is incident upon an optical element which focuses the light onto the SLM plane such that the light from each point light source illuminates the entire active pixel area of the SLM. An additional optical element focuses the light in the fast axis to generate the required spot image. The optical system of the present invention utilizes natural aberrations and/or artificial aberrations to decrease the sensitivity of the optical system to the smile phenomena exhibited by most laser diode bars.

There is therefore provided in accordance with the present invention an optical system for uniformly illuminating a target area having a predetermined aspect ratio and two independent numerical apertures in two orthogonal directions with optical power generated by a linear array of individual light sources, wherein each individual light source illuminates substantially the entire target area, the system comprising a microlens array comprising a linear array of microlenses, each the microlens for receiving and redirecting light from one of the individual light sources into a collimated beam of light in the slow axis, a first optical element for receiving and redirecting light from the linear array of light sources into collimated beams of light in a fast axis, a second optical element optically aligned with the microlens array, the second optical element for receiving light in the slow axis from the microlens array and for focusing light therefrom onto the target area, a third optical element optically aligned with the first optical element, the third optical element for receiving light in the fast axis from the first optical element and for focusing light therefrom onto the target area, and wherein either of the microlens array, the first optical element or the third optical element, singly or in combination, introduce an optical aberration into the optical system in the fast axis, the aberration for broadening the light from the linear array of individual light sources in order to reduce the sensitivity of the optical system to individual light sources that are off axis.

The microlens array is operative to refract, diffract or in combination thereto light from one of the individual light sources into a collimated beam of light in the slow axis.

The first optical element is operative to refract, diffract or in combination thereto light from one of the individual light sources into a collimated beam of light in the fast axis.

The first optical element comprises a cylindrical lens. The second optical element comprises a cylindrical lens. The third optical element comprises a cylindrical lens.

There is also provided in accordance with the present invention an optical system for uniformly illuminating a target area having a predetermined aspect ratio and two independent numerical apertures in two orthogonal directions with optical power generated by a linear array of individual light sources, wherein each individual light source illuminates substantially the entire target area, the system comprising a microlens array comprising a linear array of microlenses, each the microlens for receiving and redirecting light from one of the individual light sources into a collimated beam of light in the slow axis, a first optical element for receiving and redirecting light from the linear array of light sources into collimated beams of light in a fast axis, a second optical element optically aligned with the microlens array, the second optical element for receiving light in the slow axis from the microlens array and for focusing light therefrom onto the target area, a third optical element optically aligned with the first optical element, the third optical element for receiving light in the fast axis from the first optical element and for focusing light therefrom onto the target area, and aberration means for broadening the light from the linear array of individual light sources in order to reduce the sensitivity of the optical system to individual light sources that are off axis, the aberration means placed in the fast axis of the optical system.

Further, the aberration means comprises a glass plate inserted in the fast axis of the optical system, the glass plate operative to introduce at least one aberration into the optical system.

In addition, there is provided in accordance with the present invention an optical system for uniformly illuminating a target area having a predetermined aspect ratio and two independent numerical apertures in two orthogonal directions with optical power generated by a linear array of individual light sources, wherein each individual light source illuminates substantially the entire target area, the system comprising a microlens array having a plurality of microlenses, each the microlens for receiving and redirecting light from one of the individual light sources into a collimated beam of light in the slow axis, an off axis cylindrical parabolic mirror for receiving and reflecting light from each of the individual light sources into a plurality of collimated beams of light in a fast axis, a second optical element optically aligned with the off axis cylindrical parabolic mirror, the second optical element for receiving light in the slow axis from the off axis cylindrical parabolic mirror and for focusing light therefrom onto the target area, and a third optical element optically aligned with the first optical element, the third optical element for receiving light in the fast axis from the first optical element and for focusing light therefrom onto the target area.

Further, there is provided in accordance with the present invention an optical system for uniformly illuminating a target area having a predetermined aspect ratio and two independent numerical apertures in two orthogonal directions with optical power generated by a plurality of linear arrays of individual light sources, wherein each individual light source illuminates substantially the entire target area, the system comprising a plurality of microlens arrays, each microlens array comprising a linear array of microlenses, each the microlens array associated with one of the linear array of light sources, each microlens for receiving and redirecting light from one of the individual light sources into a collimated beam of light in the slow axis, a plurality of first optical elements for receiving and redirecting light from the linear array of light sources into collimated beams of light in a fast axis, each first optical element associated with one of the linear arrays of light sources, a second optical element optically aligned with the plurality of microlens arrays, the second optical element for receiving light in the slow axis from the plurality of microlens arrays and for focusing light therefrom onto the target area, and a third optical element optically aligned with the plurality of first optical elements, the third optical element for receiving light in the fast axis from the plurality of first optical elements and for focusing light therefrom onto the target area.

There is also provided in accordance with the present invention an optical system for uniformly illuminating a target area having a predetermined aspect ratio and two independent numerical apertures in two orthogonal directions with optical power generated by a plurality of linear arrays of individual light sources, wherein each individual light source illuminates substantially the entire target area, the system comprising a microlens array comprising a linear array of microlenses, each microlens for receiving and redirecting light from a plurality of individual light sources into collimated beams of light in the slow axis, a plurality of first optical elements for receiving and redirecting light from the linear array of light sources into collimated beams of light in a fast axis, each first optical element associated with one of the linear arrays of light sources, a second optical element optically aligned with the microlens array, the second optical element for receiving light in the slow axis from the microlens array and for focusing light therefrom onto the target area, and a third optical element optically aligned with the plurality of first optical elements, the third optical element for receiving light in the fast axis from the plurality of first optical elements and for focusing light therefrom onto the target area.

In addition, there is provided in accordance with the present invention an optical system for uniformly illuminating a target area having a predetermined aspect ratio and two independent numerical apertures in two orthogonal directions with optical power generated by a first linear array of individual light sources and a second linear array of individual light sources, wherein each individual light source illuminates substantially the entire target area, the system comprising a first microlens array and a second microlens array, the first microlens array comprising a first linear array of microlenses, the second microlens array comprising a second linear array of microlenses, the first microlens array associated with the first linear array of light sources, the second microlens array associated with the second linear array of light sources, each microlens for receiving and redirecting light from the individual light sources into a collimated beam of light in the slow axis, a first optical element and a second optical element for receiving and redirecting light from the first and second linear array of light sources, respectively, into collimated beams of light in a fast axis, a prism comprising at least two mirrored sides, the prism suitably positioned to closely place together in parallel the collimated beams of light from the first and second optical element, a third optical element optically aligned with the first microlens arrays and the second microlens arrays, the second optical element for receiving light in the slow axis from the first microlens array and the second microlens array and for focusing light therefrom both onto the target area, and a fourth optical element optically aligned with the first and second optical elements, the fourth optical element for receiving light in the fast axis from the first and second optical elements and for focusing light therefrom onto the target area.

BRIEF DESCRIPTION OF THE DRAWINGS

The invention is herein described, by way of example only, with reference to the accompanying drawings, wherein:

FIG. 1A is a schematic diagram illustrating a conventional laser diode bar (LDB) light source including its fast and slow axis;

FIG. 1B illustrates the near field image of the light source in the slow axis;

FIG. 1C illustrates the far field image of the light source in the slow axis;

DETAILED DESCRIPTION OF THE INVENTION

As used throughout this document, the term illumination of pixels refers to the case of light from a plurality of light sources, e.g., a plurality of laser diode emitters, passing through an optical element, wherein the light from each source is projected on a plurality of pixels within, e.g., an SLM. Imaging, on the other hand, refers to the case of light from each light source, e.g., each individual laser emitter, passing through an optical element to generate an image of the source on a plurality of pixels within, e.g., an SLM.

Figure 1D:
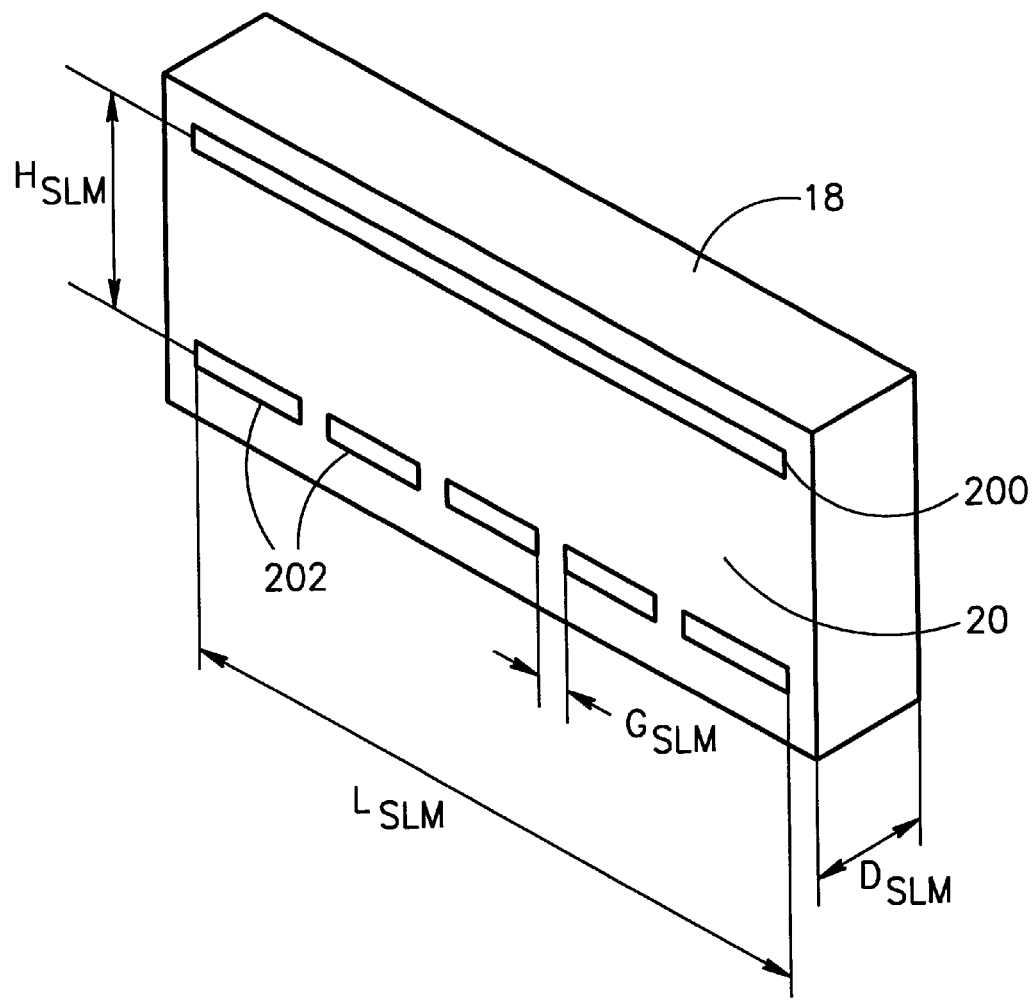
FIG. 1D is a schematic diagram illustrating a conventional spatial light modular (SLM)
Figures 2A, 2B:
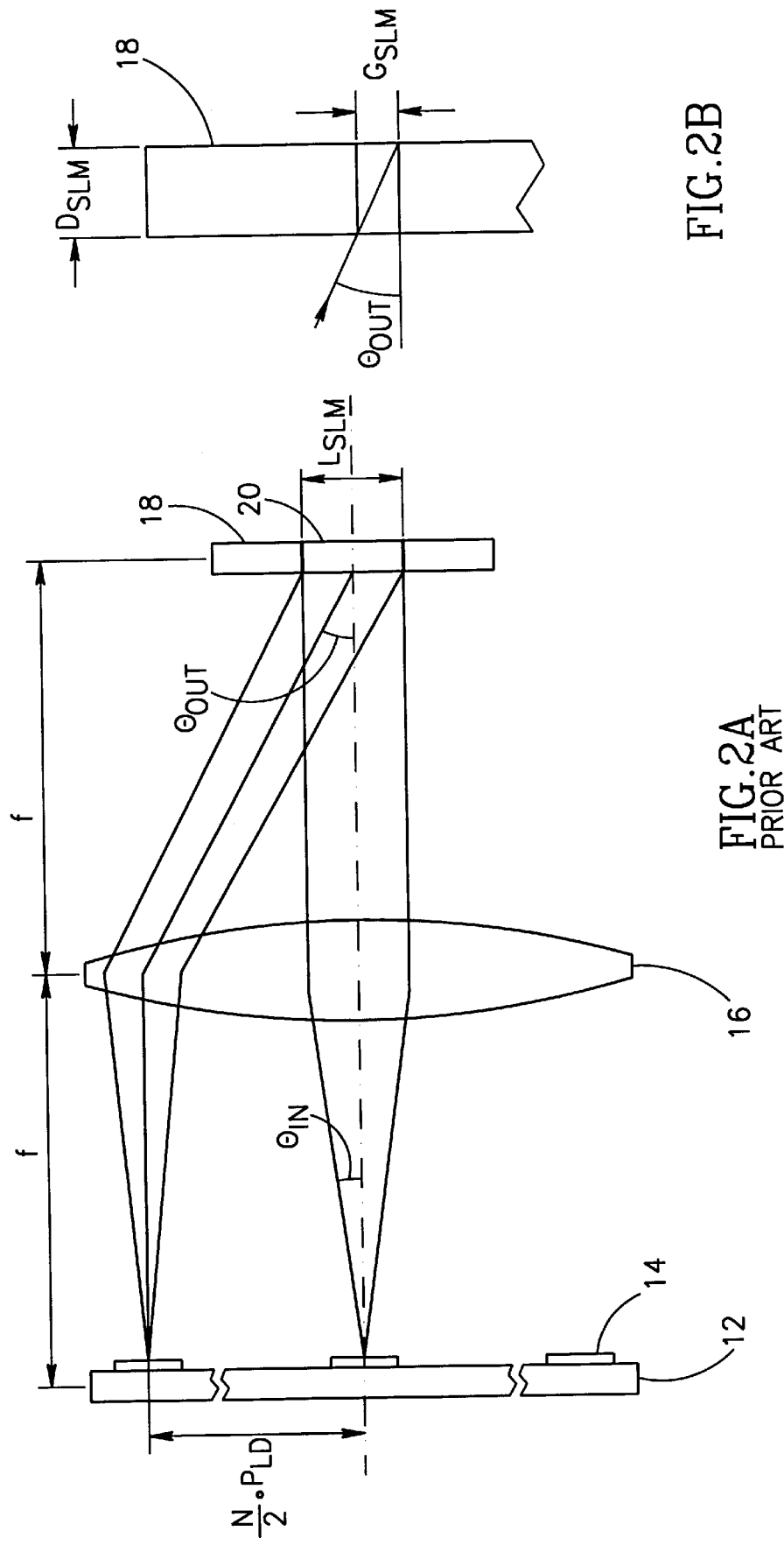
FIG. 2A is a prior art spatial light modulator illumination system imaging the far field of the LDB light source.
FIG. 2B is a top sectional view of a conventional SLM illustrating the light ray incident onto the SLM.
Figure 3:
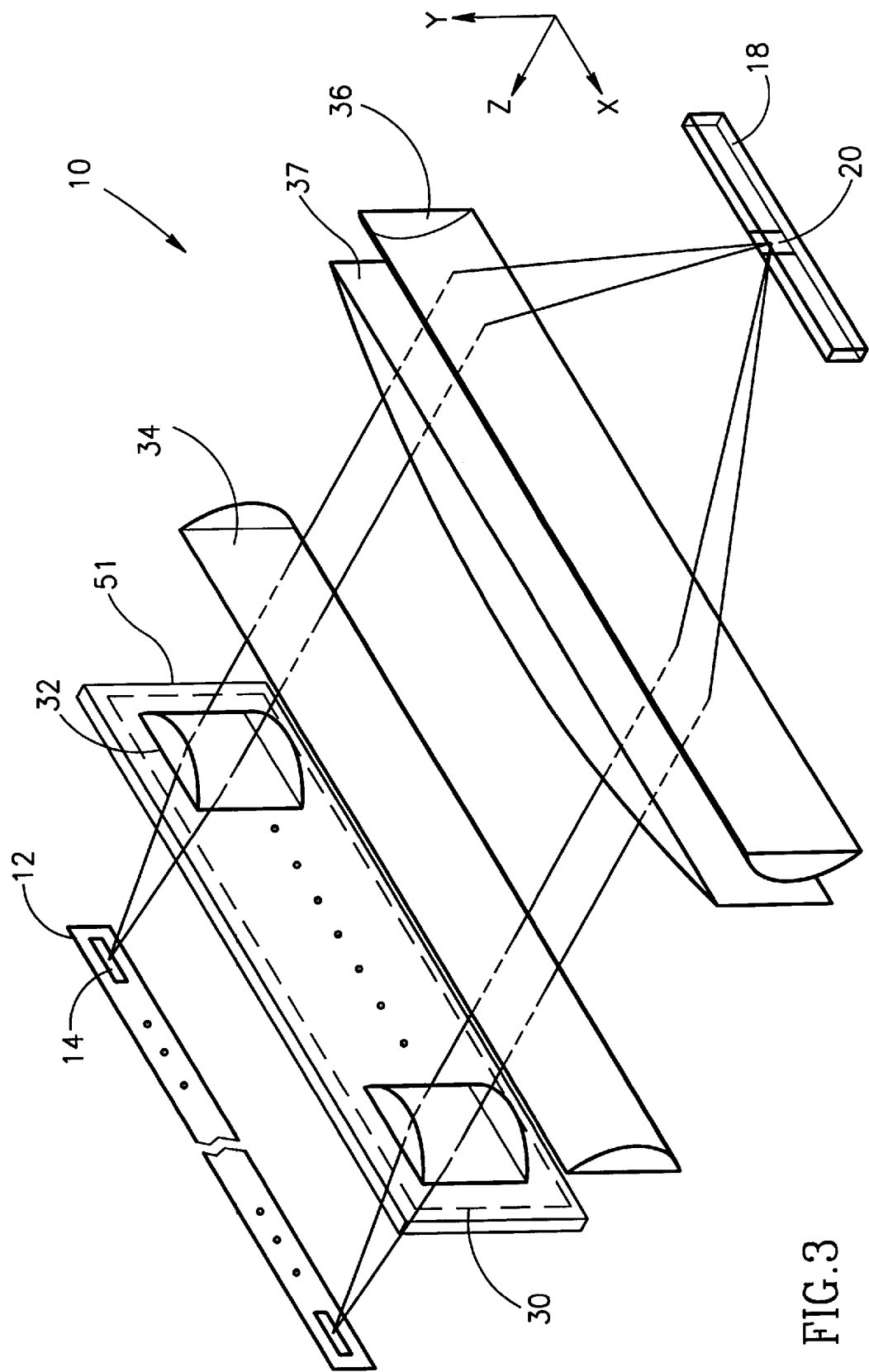
FIG. 3 is a perspective view schematic diagram illustrating a spatial light modulator illumination system constructed in accordance with a first embodiment of the present invention.

A perspective view schematic diagram illustrating a spatial light modulator illumination system, generally referenced 10, having a linear array laser diode bar (LDB) source and constructed in accordance with a first embodiment of the present invention is shown in FIG. 3. The system 10 comprises an LDB 12 having a plurality of laser diode emitters 14. For clarity only two of the laser diode emitters 14 are shown positioned on either end of the bar. The light output from each element of the LDB 12 is channeled to illuminate a microlens array 30 placed in the slow axis. The microlens array comprises a plurality of microlenses 32. Each lens 32 can be a simple cylindrical lens (shown) or a spherical lens. Each microlens 32 channels the light from a separate element in the LDB. The pitch of the microlenses 32 are set to match the pitch between the emitters 14 of the LDB 12. The LDB and the microlens are suitably positioned such that a variation, by a few tens of microns, in the position of a laser diode element perpendicular to the line of the LDB will not significantly effect the performance of the laser diode illumination, in the case when cylindrical lenses are used. In addition, the microlens array 30 is placed at a distance from the LDB equal to the focal length of the microlens 30. Further, the distance the microlens is placed from the LDB is less than the distance where light from adjacent emitters begins to overlap onto each other.

In the fast axis, the light from the LDB 12 is redirected by an optical element 34. Throughout this document, the term redirection includes refraction (e.g., a refractive lens or refractive lens assembly), diffraction (e.g., a diffractive element), reflection or any other type of manipulation of the light or the combination thereof. The optical element 34 is positioned such that it is in optimum position to illuminate optical element 36. Optical element 36 functions to focus the light beam in the fast axis direction onto the SLM 18 active pixel area 20. Optical element 36 may comprise a lens assembly having at least one anamorphic or cylindrical lens. In the fast axis, light from the LDB also passes through the microlens array 30 and the optical element 37.

In the slow axis, the light from each individual laser diode emitter 14 in the LDB 12 is redirected by one of the microlens 32 in the microlens array 30. The light redirected by the microlens array 30 is then redirected by optical element 37 to form a line spot on the active pixel area 20 on the SLM 18. Optical element 37 may comprise a lens assembly having at least one anamorphic or cylindrical lens. Using this approach, each laser diode emitter functions to illuminate the entire SLM active area 20. In the slow axis, light from the LDB also passes through the optical element 34 and the optical element 36.

The microlens array 30 and optical element 34 are positioned sufficiently far apart from optical elements 37, 36 to permit the insertion of other optical elements to manipulate the collimated light beams. Such optical elements include but are not limited to polarizers, waveplates, neutral density filters and beam homogenizers. For example, some types of SLMs require polarization rotators to be inserted in order to operate properly.

As used in a typical optical printing head system, the light output from optical elements 36, 37 illuminate the multi-element SLM which modulates the light beams in accordance with the image data. The modulated light beams are then focused on the writing media (not shown). Various types of SLMs may be used in the present invention, they include, but are not limited to, digital mirror devices (DMDs), deformable mirror devices (DMDs), membrane mirror light modulators (MLMs), liquid crystal arrays (LCs) and ferroelectric liquid crystal arrays (FLCs). In addition, the SLM may be either linear or two dimensional. Commercially available SLMs suitable for use in the present invention include: Texas Instruments DMD (with VGA resolution of 640×480 pixels or 7064×64), CRL two dimensional ferroelectric liquid crystal (FLC) model 2DX320 and SLM model DR0256B or 10*10B manufactured by Displaytech. In addition, the SLM may comprise a membrane mirror light modulator, model W-MLM, manufactured by Optron Systems, Bedford, Mass. The SLM may also comprise a mechanically active/anti-reflective device. The above disclosed SLM are two dimensional SLMs, however, suitable linear SLMs are also available from most of these manufactures.

Figure 4:
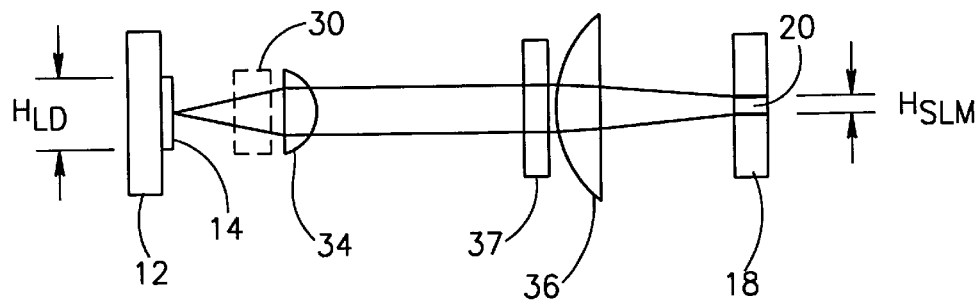
FIG. 4 illustrates the optical path of the fast axis of the spatial light modulator system of FIG. 3.

The fast axis of the spatial light modulator system of FIG. 3 is illustrated in FIG. 4. The LDB 12 is illustrated with a side view of laser diode emitters 14. The height of a typical laser diode emitter is, for example, approximately 1 micron. A lens 34 couples the near field light from the emitters 14 in the fast axis to optical element 36. The light emitted from the optical element 34 is redirected by optical element 36 to light the active pixel area 20 within SLM 18. Both optical elements 34 and 36 may comprise cylindrical lens.

The optics included in lens 34 and 36 function to magnify the 1 micron light source to the approximate 20 to 100 micron height of the active pixel area 20 of the SLM 18. This level of magnification is needed if the optical elements are of high quality with low aberrations. In addition, the combination of the optical element compensates for the smile effect of the laser diode emitters in the LDB. The smile effect is compensated for by introducing a mild aberration in a controlled manner into one or a combination of the microlens array 30, optical element 34 or optical element 36. The slight aberration generated, functions to broaden the light source to reduce the sensitivity of the system to the off axis laser diode emitters. More specifically, the aberration(s) acts to expand the emitter point sources of the LDB to an equivalent of approximately 10 microns. This is in contrast to the actual dimension of the emitters of 1 micron.

Alternatively, a glass slide can be positioned between the LDB and the lens 34 to provide the necessary aberrations if, for example, the optical element 34 used does not have sufficient aberration, i.e., it is of very high quality with minimum aberrations. For example, many microlenses typically comprise a glass slide for mechanical strength. This glass slide can function to provide the required aberration. Note that the glass slide can be utilized in combination with the optical elements 34 or 36 to generate sufficient aberrations. Once the aberrations are present, the smile effect is rendered virtually inconsequential.

Figure 5:
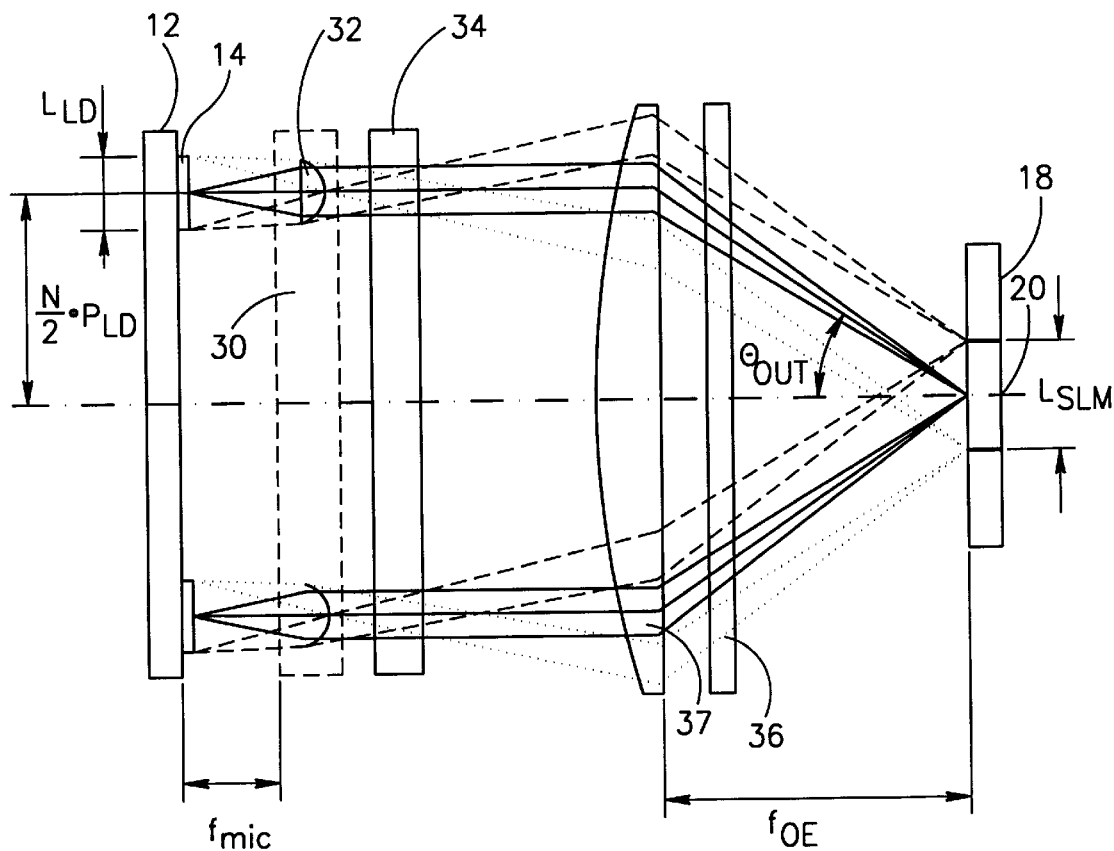
FIG. 5 illustrates the optical path of the slow axis of the spatial light modulator system of FIG. 3.

The slow axis of the spatial light modulator system of FIG. 3 is illustrated in FIG. 5. The LDB 12 is illustrated partially with only the two end and middle emitters 14 shown for clarity. The microlens array 30 is shown from a top end perspective with only the three microlenses 32 associated with the laser diode emitters 14 shown for clarity. The near field light pattern generated by the LDB source is imaged in the slow axis by microlenses 32 and optical element 37. Each microlens functions to collimate the light into nearly parallel beams. The light from the microlenses pass through the optical elements 34, 36. Optical element 37 functions to redirect the light onto the active pixel area 18 of the SLM 20, thus imaging the near field top hat pattern of the LDB onto the SLM.

The following optical system is presented as an illustrative example. The focal length of the microlens 32 is represented as $f_{MIC}$ and the length of a single emitter is represented as $L_{LD}$. A goal of the optical system presented in the this example is to magnify the length of a single laser emitter to the length of the SLM ($L_{SLM}$). With reference to FIG. 5, the focal length $f_{OE}$ of the optical element 37 can be expressed as $$f_{OE} = \frac{L_{SLM}}{L_{LD}} \cdot f_{MIC}$$

In this example, the following parameters are given:
$L_{SLM}$=4 mm
$L_{LD}$=0.08 mm
$f_{MIC}$=2.0 mm
$NP_{LD}$=10 mm
$G_{SLM}$=6 microns The focal length $f_{OE}$ of the optical element in this case is thus 100 mm. The $NA_{OUT}$ at the SLM is given by the following expression $$NA_{OUT} \approx \frac{N \cdot P_{LD}}{2 \cdot f_{OE}}$$

Substituting the above given quantities, the $NA_{OUT}$ at the SLM is approximately 0.05.

As discussed previously, the maximum depth of the SLM can be expressed as $$D_{SLM} < \frac{G_{SLM}}{\tan(\theta_{OUT})}$$

Further, since the angles involved here are relatively small, the term $\tan(\theta_{OUT})$ can be approximated by the NA yielding $$D_{SLM} < \frac{G_{SLM}}{NA}$$

Thus, the maximum depth of the SLM in this case is 120 microns. This is a vast improvement compared to the maximum depth of 11 microns achieved using the optical system of the prior art. Thus, use of the optical system of the present invention, permits the use of a greater range of SLMS, since the maximum depth that the system can handle is greatly increased. This advantage is brought about by the use of the microlens which serves to provide a collimated beam to the optical element. Providing a collimated beam permits the use of an optical element having a much higher focal length, thus achieving a low NA at the SLM. In addition, use of the microlens serves to image the near field of the laser emitters onto the SLM rather than the far field of the emitters.

Figure 6:
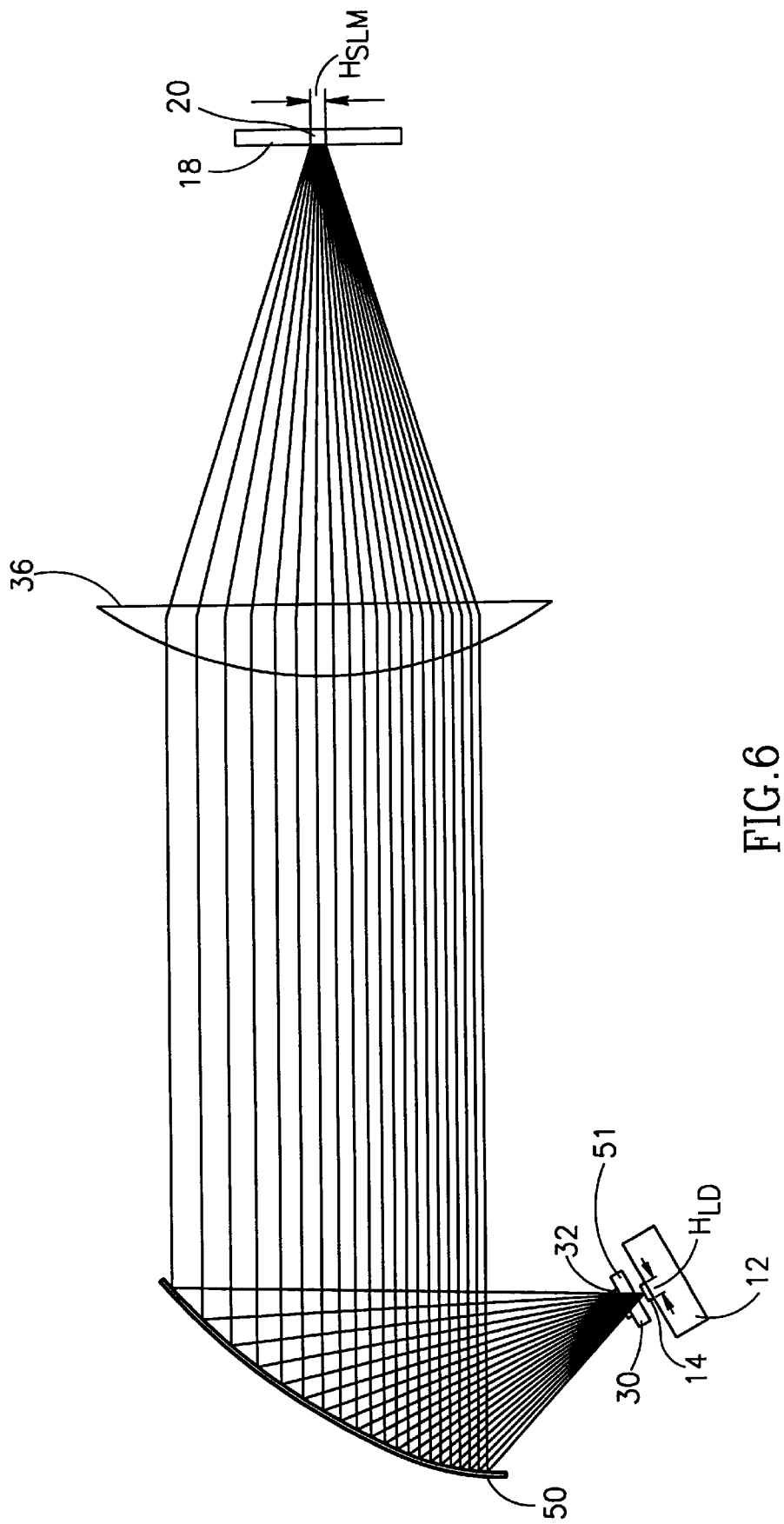
FIG. 6 is a high level schematic diagram illustrating the optical path of the fast axis of a spatial light modulator illumination system utilizing an off axis cylindrical parabolic mirror constructed in accordance with a second embodiment of the present invention.

In a second embodiment of the present invention, the optical element 34, used to collimate the light from the LDB emitters, is replaced with an off axis cylindrical parabolic mirror. In this embodiment the parabolic mirror replaces optical element 34 while the slow axis imaging remains the same. A high level schematic diagram illustrating the fast axis of a spatial light modulator illumination system constructed using an off axis parabolic mirror in accordance with a second embodiment of the present invention is shown in FIG. 6. The system comprises an LDB light source 12 having a plurality of laser diode emitters 14, as in the first embodiment. The LDB is positioned such that the light output from the emitters, in the fast axis, is incident onto an off axis cylindrical parabolic mirror 50. The LDB 12 is positioned such that the emitters 14 are situated at the focus of the off axis cylindrical parabolic mirror 50. A microlens array 30 comprising a plurality of microlenses 32 functions to redirect the light from the LDB in the slow axis in similar fashion to the first embodiment of FIG. 3. In addition, a glass slide 51 can be inserted between the microlens array 30 and the LBD 12. As previously described, the glass slide portion of the microlens itself can be utilized.

Due to the inherent nature of an off axis cylindrical parabolic mirror, the light reflected off the parabolic mirror is collimated in parallel light rays. Other advantages of using a parabolic mirror include its relatively low cost of manufacture and its ability to collect and reflect light in an efficient manner with both high and low NA light sources. The light reflected off the mirror is incident on optical element 36 which functions to focus the light onto the active pixel area 20 of SLM 18. As with the previous embodiment, for example, the approximate height, HLH of the laser diode emitter is one micron and the approximately height, HSLM of the active pixel portion of the SLM is 50 to 100 microns.

The optical element 36 may comprise a combination of anamorphic, cylindrical or spherical lenses. As was described before in connection with FIG. 3, a glass slide can be positioned between the LDB and the optical element 34 to provide the aberrations required to minimize the effect of the smile phenomena exhibited by the LDB.

Figure 7:
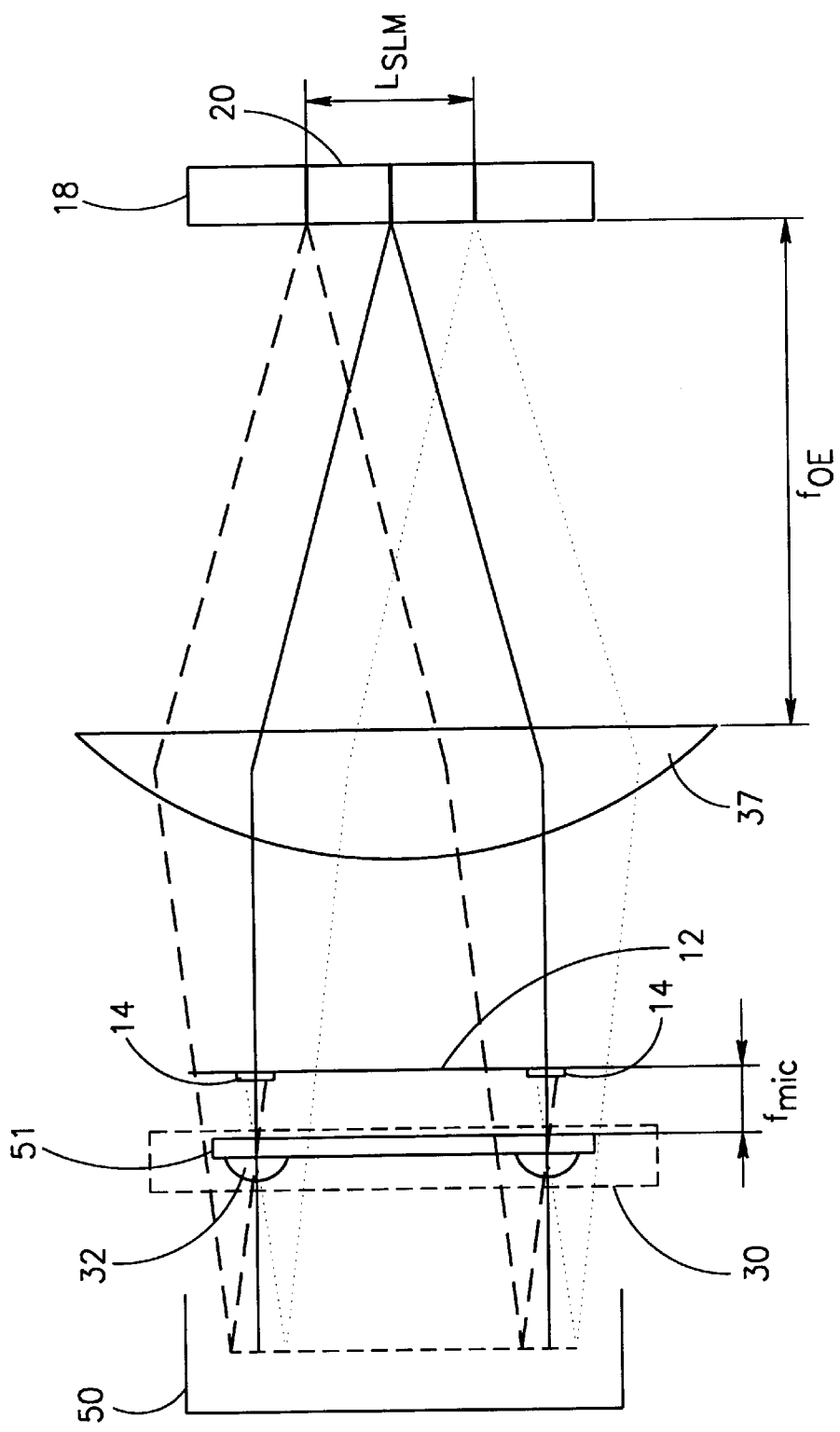
FIG. 7 illustrates the optical path of the slow axis of the spatial light modulator system of FIG. 6.

A high level schematic diagram illustrating the slow axis of a spatial light modulator illumination system constructed using an off axis cylindrical parabolic mirror in accordance with the second embodiment of the present invention is shown in FIG. 7. The components of the optical system are shown in a top plan view. Only two laser diode emitters 14 of the LDB 12 are shown for clarity sake. The light emitted from the LDB passes through the glass slide or plate 51 and is redirected by microlens array 30. Each microlens 32 within the array 30 function to redirect and focus the light incident on it into collimated beams. The light is then reflected off the mirrored surface of the off axis parabolic mirror 50 onto optical element 37. Optical element 37 functions to focus the light from each individual laser diode emitter onto the entire active pixel area 20 of the SLM 18.

Figure 8:
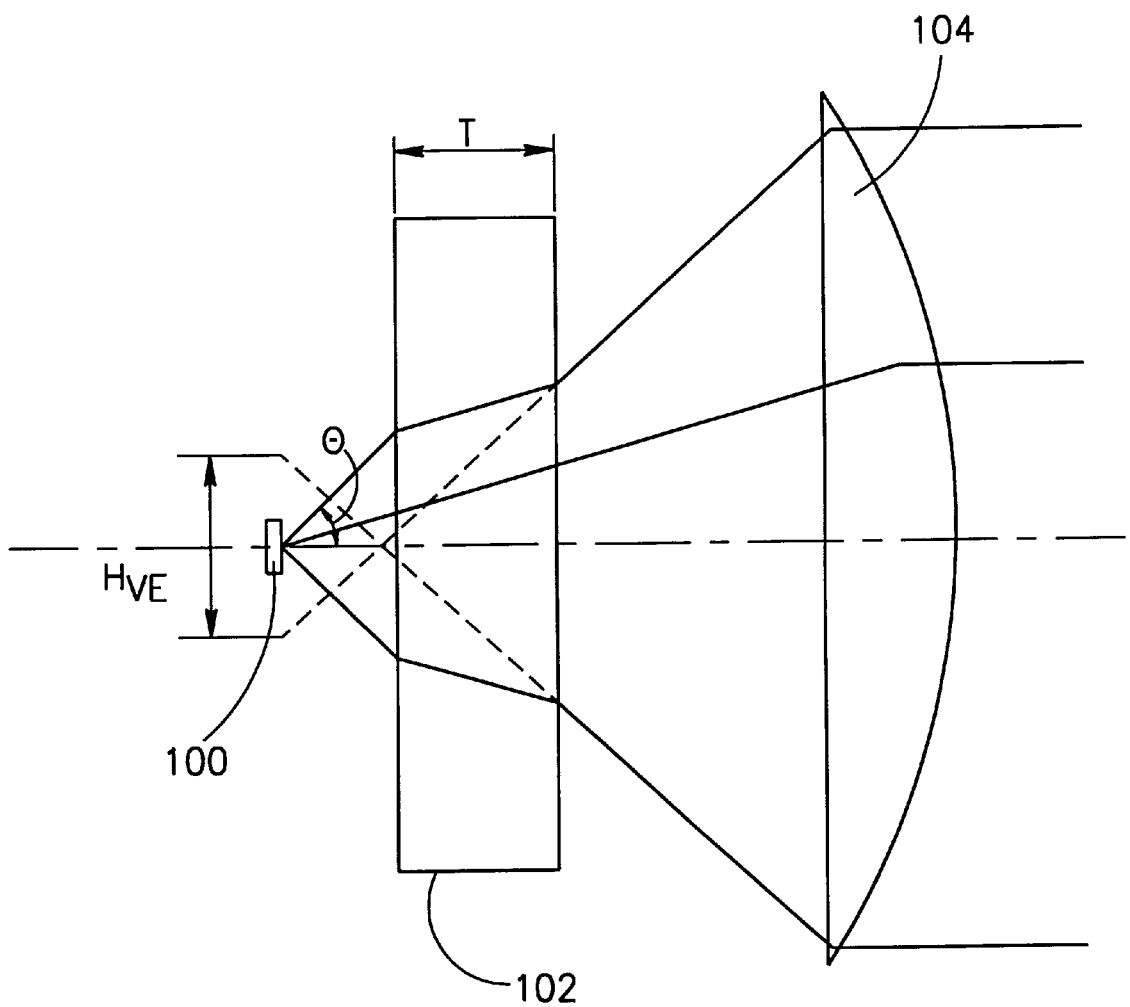
FIG. 8 is a schematic diagram illustrating the broadening of the light source created by the aberrations of a glass plate placed in the optical path.

As described previously with reference to the first and second embodiments, a glass plate or slide can be inserted between the LDB 12 and the microlens array 30 (FIGS. 3 and 6) to add a slight aberration to the optical system. This aberration functions to reduce the effect of the smile phenomena of the LDB. The reason for this will now be explained in more detail. A schematic diagram illustrating the virtual light source created by the aberrations of a glass plate placed in the optical path is shown in FIG. 8. The fast axis of a sample optical system is shown. The optical system comprises an LDB 100 having a plurality of laser diode emitters, a glass plate or slide 102 and an optical element 104. The light emitted by the LDB is incident on the glass plate 102 which ideally has flat surfaces on both sides in the axis direction. The light hitting the glass plate is redirected and emerges as a light ray that travels in a path parallel with the incident light ray. The light ray that emerges, however, is displaced a short distance from the incident ray. The dotted lines represent the virtual light source that the emerged light rays would have come from if the glass plate were not there. It is these displaced light rays that the optical element 104 sees. The amount of displacement of the light rays is dependent on the angle of the incident ray and is given in the equation presented below. The larger the angle, the higher the displacement distance. To the optical element 104, the light source appears as a virtual emitter having a height $H_{VE}$ as indicated in the Figure.

If θ is the angle between a light ray and the normal to the plate of glass having a thickness T and the refraction index n is given at the appropriate wavelength, the virtual displacement $H_{VE}$ can be expressed as $$H_{VE} = 2 \cdot T \cdot \left[ \tan(\theta) - \frac{1}{n} \cdot \frac{\sin(\theta)}{\sqrt{1 - \left(\frac{\sin(\theta)}{n}\right)^2}} \right]$$

Further, the virtual emitter height for an emitter of the LDB that is displaced somewhat from the center axis due to the smile effect is correspondingly shifted by an amount equal to the smile distance. The enlarged virtual emitter functions to reduce the effect of the smile problem. For example, an LDB may have emitters having a height of 1 micron. Assume that one or more of the emitters is situated off axis by an amount 2 microns. This results in an error of 200% in the location of the light source.

These same emitters may have, for example, a corresponding 20 micron virtual emitter height $H_{VE}$. Assuming an emitter off axis by a distance, for example, of 2 microns, the corresponding virtual emitter height HVE will also be 20 microns but it will be shifted by a distance of 2 microns due to the smile effect. In this case, the error has been reduced to 10%. Thus, the relative error caused by the smile effect is greatly reduced.

It is important to note that the smile phenomena is more pronounced in the embodiment of the present invention that utilizes a parabolic mirror to reflect the light from the LDB. In this case, the glass slide 51 (FIG. 6) functions to smear the effect of the smile in the manner described above. Lenses, however, are less sensitive to the smile effect due to naturally occurring spherical aberrations. Optical systems that employ lenses of very high quality may still suffer somewhat from the smile effect if spherical aberrations are minimized enough in the lenses making up the optical system.

Figure 9:
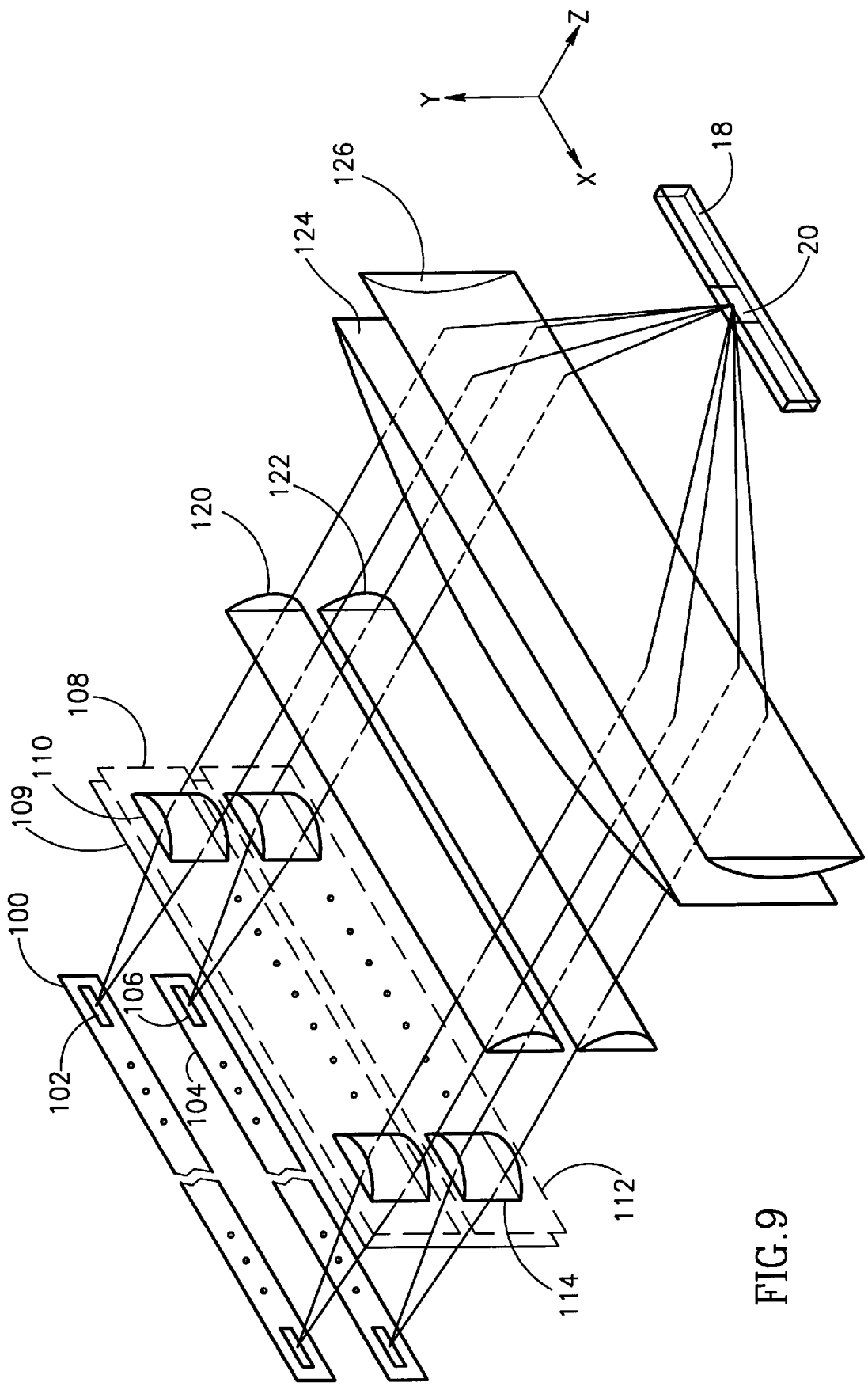
FIG. 9 is a perspective view schematic diagram illustrating a spatial light modulator illumination system utilizing more than one laser diode bar constructed in accordance with a third embodiment of the present invention.

A perspective view schematic diagram illustrating a spatial light modulator illumination system utilizing more than one laser diode bar constructed in accordance with a third embodiment of the present invention is shown in FIG. 9. This embodiment is similar to the first embodiment of FIG. 3. In this embodiment, however, a second LDB and corresponding optical elements have been added. Two or more LDBs may be needed in order to increase the average power incident on the media.

Two LDBs 100, 104, each comprise a plurality of laser diode emitters 102, 106, respectively. In the slow axis, the light from LDB 100 is incident on microlens array 108. The light from the microlens array 108 is then redirected by optical element 124 which focuses the light onto the active pixel area 20 of the SLM 18. Also in the slow axis, the light from LDB 104 is incident on microlens array 112. The light from the microlens array 112 is also redirected by optical element 124 to impinge on the active portion of the SLM. Optical element 124 comprises one or more lens such as an anamorphic lens, cylindrical lens, etc.

In the fast axis, light from the LDB 100 is redirected by optical element 120. The light from optical element 120 is then incident on and redirected by optical element 126. Optical element 126 functions to focus the light onto the active pixel area 20 of the SLM 18. Similarly, light from the LDB 104 is redirected by optical element 122. The light from optical element 122 is also incident on and redirected by optical element 126 which focuses the light onto the SLM. Optical elements 120, 122 and 126 may comprise one or more lens such as an anamorphic lens, cylindrical lens, spherical lens, etc.

As in the previous embodiment, a glass plate (not shown) can be inserted between each of the LDBs 100, 104 and the microlens arrays 108, 122, respectively, to decrease the effects of the smile phenomena. Further, note that by using the principles of this embodiment, one skilled in the art could construct an embodiment having more than two LDBs.

Figure 10:
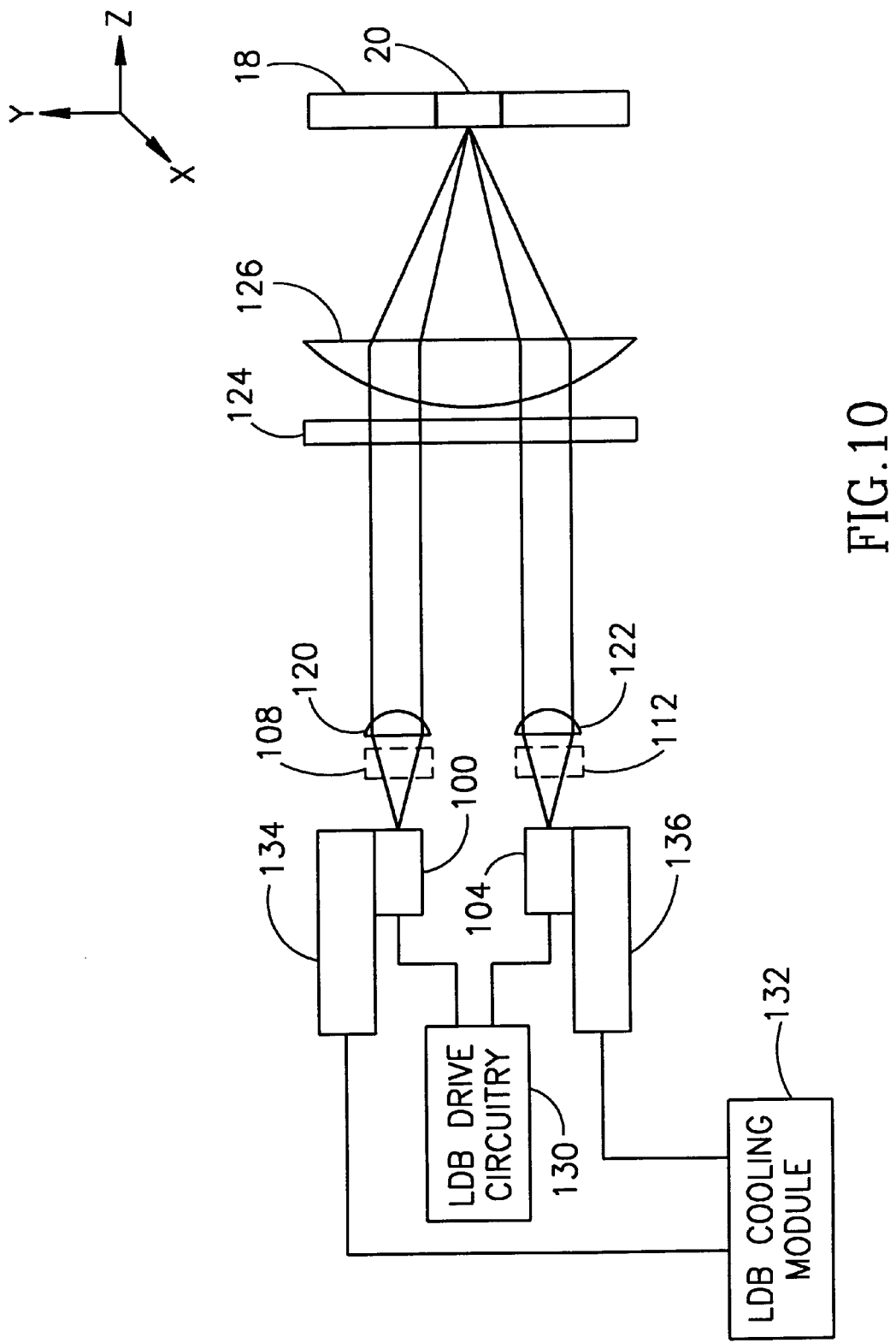
FIG. 10 illustrates the optical path of the fast axis of the spatial light modulator system of FIG. 9.

The optical path of the fast axis of the spatial light modulator system of FIG. 9 is illustrated in FIG. 10. The two LDBs are positioned in a stacked configuration, preferably, with the emitting portion of each LDB as close to each other as possible.

Light from the LDB 100 is redirected by optical element 120 and is incident on optical element 126. Optical element 126 focuses the light onto the SLM 18. The LDBs 100, 104 are mechanically and thermally coupled to bases 134, 136, respectively. The bases provide mechanical support and provide cooling means for the LDBs. Both bases are coupled to LDB cooling module 132 which functions to maintain the LDBs at an acceptable operating temperature. In addition, the LDBs are electrically connected to LDB drive circuitry 130. The drive circuitry functions to control the operation of the LDBs laser diode emitters.

Figure 11:
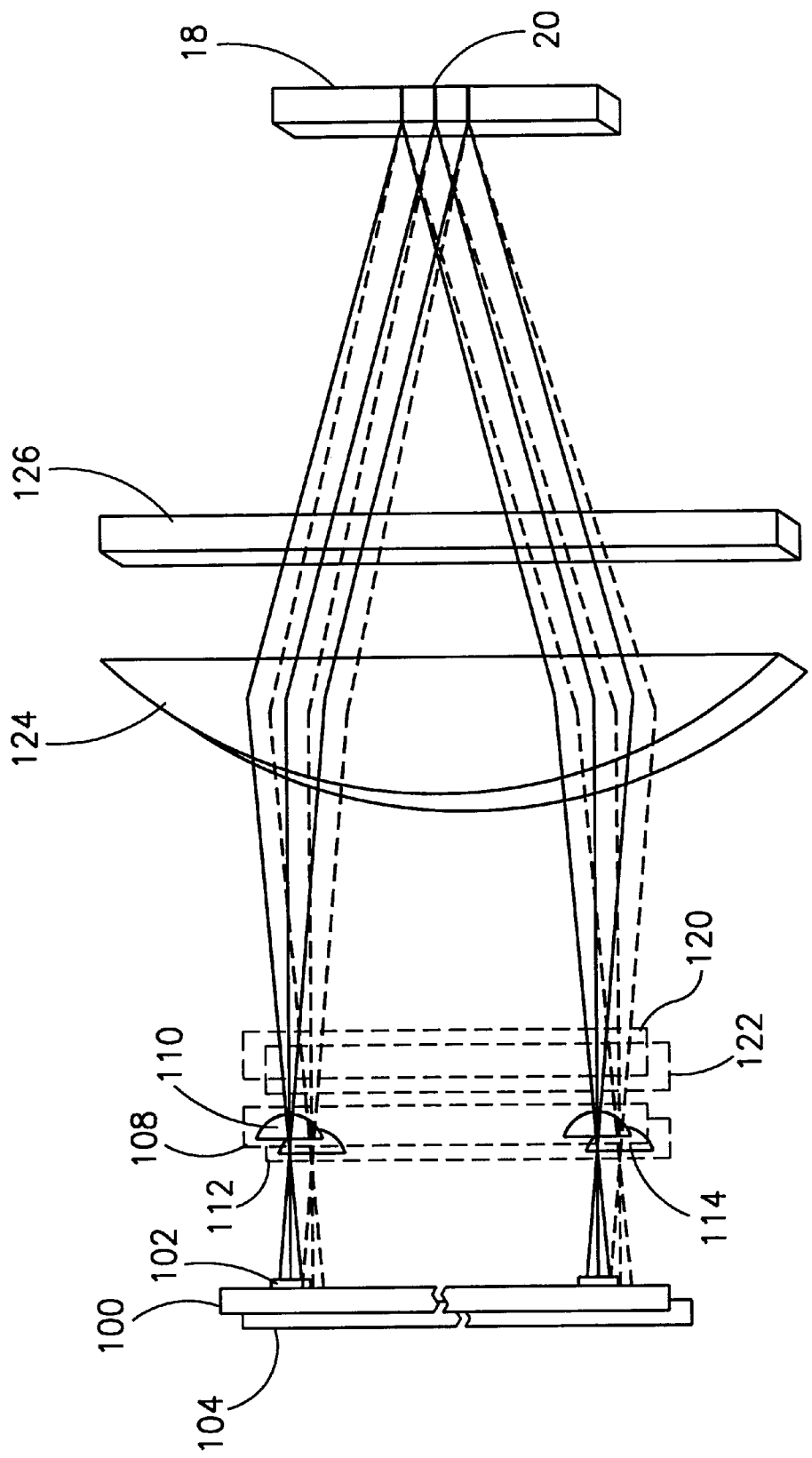
FIG. 11 illustrates the optical path of the slow axis of the spatial light modulator system of FIG. 9.

The optical path of the slow axis of the spatial light modulator system of FIG. 9 is illustrated in FIG. 11. As described previously, light from the two LDBs 100, 104 is redirected by microlens arrays 108, 112, respectively. Light from each emitter is redirected by one of the microlenses 110, 114 of arrays 108, 112, respectively. Light from both arrays is then redirected by optical element 124 which focuses the light onto the active pixel area 20 of the SLM 18.

Figure 12:
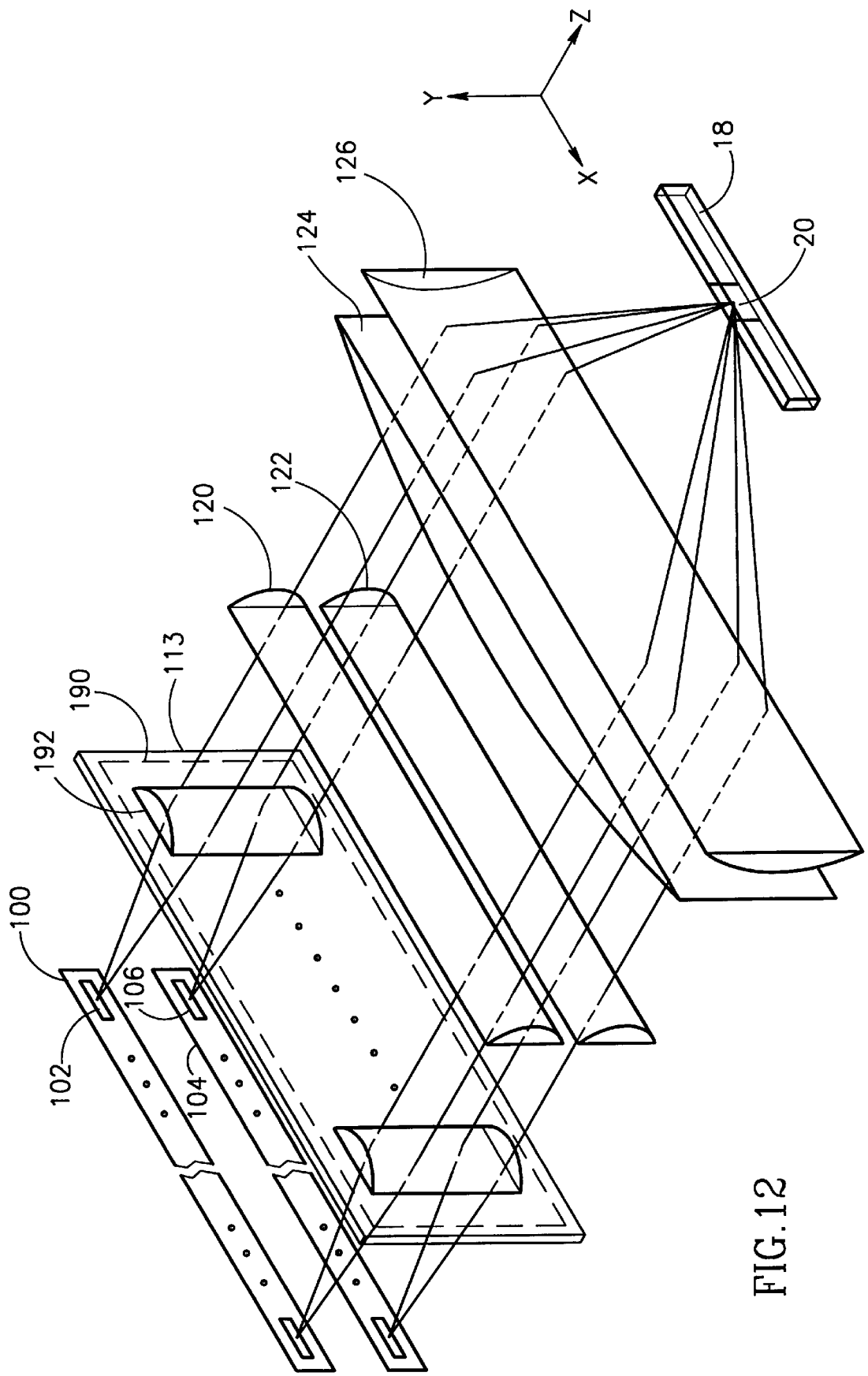
FIG. 12 is a perspective view schematic diagram illustrating a spatial light modulator illumination system, utilizing more than one laser diode bar and a single microlens array for all laser diode bars, constructed in accordance with a fourth preferred embodiment of the present invention.

Alternatively, the two microlens arrays 108, 112 of the third embodiment of FIG. 9 can be constructed as a single microlens array. A perspective view schematic diagram illustrating a spatial light modulator illumination system, utilizing more than one laser diode bar and a single microlens array for all laser diode bars, constructed in accordance with a fourth preferred embodiment of the present invention is shown in FIG. 12. The construction and operation of the optical system of FIG. 12 is similar to that of FIG. 9 with the exception that the system of FIG. 12 comprises a single microlens array 190 having a plurality of microlens 192.

Figure 13:
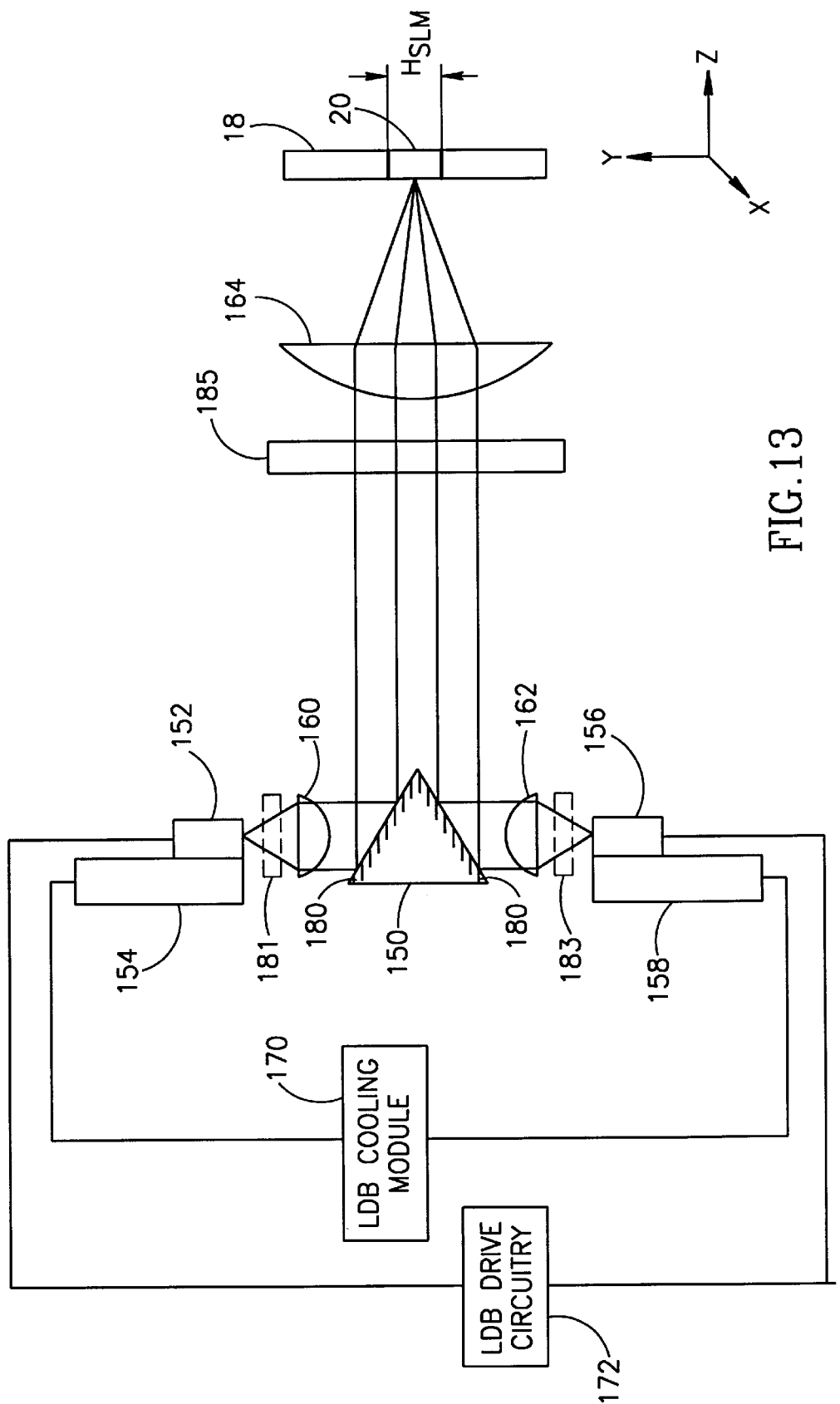
FIG. 13 is a schematic diagram illustrating the fast axis of a spatial light modulator illumination system utilizing a mirrored prism constructed in accordance with a fifth embodiment of the present invention

Another method of combining the light output of two LDBs is to utilize a mirrored prism. A schematic diagram illustrating the fast axis of a spatial light modulator illumination system utilizing a mirrored prism constructed in accordance with a fifth embodiment of the present invention is shown in FIG. 13. In the fast axis, the light emitted from two LDBs 152, 156 is collimated by optical elements 160, 162, respectively. The collimated light beams are then reflected off the mirrored sides 180 of a prism 150 (represented by the hatching in the Figure). The light from optical elements 160, 162, reflected by the prism, is redirected by optical element 164 and focused onto the active pixel area 20 of the SLM 20. This fifth embodiment also comprises two microlens arrays 181, 183 having a plurality of microlenses which redirects the light from the two LDBs in the slow axis. The collimated light from the microlens arrays is reflected off the prism 150 and redirected by an optical element 185 which may be a cylindrical or an anamorphic optical element. Further, bases 154, 158 are coupled mechanically and thermally to LDBs 152, 156, respectively. LDB cooling module 170 provides cooling for the LDBs and LDB drive circuitry 172 functions to control the operation of the laser diode emitters of both LDBs.

The operation of the optical elements 160, 162, 164, microlens arrays and optical element is similar to the corresponding elements in the optical system disclosed in FIG. 9. The LDB cooling module 170 and the LDB drive circuitry 172 also function similarly to the corresponding components in the optical system of FIG. 9.

The optical system of the present invention, as described in connection with first through fifth embodiments presented above, is operative to transfer, with high efficiency, optical power from a line source, such as a LDB, built from a plurality of individual sources with different angular distribution in two orthogonal axis into a rectangular area with a particular aspect ratio and two different numerical apertures.

The combination of the microlens and optical element in the slow axis, and a pair of optical elements in the fast axis (or the off axis parabolic mirror in the second embodiment) function to illuminate the SLM with low NA, thus minimizing cross talk between pixels in the SLM. It also increases the depth of the focus on the imaging plane of the SLM.

The optical system of the present invention also functions to generate uniform illumination across all pixels of the SLM. Without even illumination, some pixels may be exposed to more light than others, necessitating the need for compensating by applying 'weights' to the modulation of the different pixels of the SLM. A calibration and compensation step is complicated, wastes energy and wastes the dynamic range of the SLM. Even illumination is achieved by imaging the near field top hat shaped profile of the LDB collected by the microlens positioned in the slow axis.

In addition, a smooth profile is achieved with minimum noise due to cross coupling of light between individual laser diode emitters, termed speckling. The present invention achieves less than 5% noise providing a smooth optical beam pattern onto the SLM.

Further, high efficiency is achieved in transferring optical power from the laser diode source to the SLM plane. This is because almost all the light generated by the LDB source is channeled onto the active pixel area of the SLM. Relatively little optical power is wasted.

Also, the optical system of the present invention exhibits high reliability in that a failure of a single laser diode emitter does not significantly impact the illumination of the SLM. Since each laser diode emitter functions to illuminate the entire SLM, single emitter failures have much less of an effect on the optical power transmitted by the SLM.

While the invention has been described with respect to a limited number of embodiments, it will be appreciated that many variations, modifications and other applications of the invention may be made.

What is claimed is:

1. An optical system for uniformly illuminating a target area having a predetermined aspect ratio and two independent numerical apertures in two orthogonal directions with optical power generated by a plurality of linear arrays of individual light sources, wherein each individual light source illuminates substantially the entire target area, said system comprising:

a plurality of microlens arrays, each microlens array comprising a linear array of microlenses, each said microlens array associated with one of said linear array of light sources, each microlens for receiving and redirecting light from one of said individual light sources into a collimated beam of light in the slow axis;

a plurality of first optical elements for receiving and redirecting light from said linear array of light sources into collimated beams of light in a fast axis, each first optical element associated with one of said linear arrays of light sources;

a second optical element optically aligned with said plurality of microlens arrays, said second optical element for receiving light in the slow axis from said plurality of microlens arrays and for focusing light therefrom onto said target area; and a third optical element optically aligned with said plurality of first optical elements, said third optical element for receiving light in the fast axis from said plurality of first optical elements and for focusing light therefrom onto said target area.

2. The optical system according to claim 1, wherein each said microlens is operative to refract light from one of said individual light sources into a collimated beam of light in the slow axis.

3. The optical system according to claim 1, wherein each said microlens is operative to diffract light from one of said individual light sources into a collimated beam of light in the slow axis.

4. The optical system according to claim 1, wherein each said microlens is operative to refract and diffract, in combination, light from one of said individual light sources into a collimated beam of light in the slow axis.

5. The optical system according to claim 1, wherein each said first optical element is operative to refract light from one of said individual light sources into a collimated beam of light in the fast axis.

6. The optical system according to claim 1, wherein each said first optical element is operative to diffract light from one of said individual light sources into a collimated beam of light in the fast axis.

7. The optical system according to claim 1, wherein each said first optical element is operative to refract and diffract, in combination, light from one of said individual light sources into a collimated beam of light in the fast axis.

8. The optical system according to claim 1, further comprising aberration means for broadening the light from said linear array of individual light sources in order to reduce the sensitivity of said optical system to individual light sources that are off axis, said aberration means placed in the fast axis of said optical system.

9. An optical system for uniformly illuminating a target area having a predetermined aspect ratio and two independent numerical apertures in two orthogonal directions with optical power generated by a first linear array of individual light sources and a second linear array of individual light sources, wherein each individual light source illuminates substantially the entire target area, said system comprising:

a first microlens array and a second microlens array, said first microlens array comprising a first liar array of microlenses, said second microlens array comprising a second linear array of microlenses, said first microlens array associated with said first linear array of light sources, said second microlens array associated with said second linear array of light sources, each microlens for receiving and redirecting light from said individual light sources into a collimated beam of light in the slow axis;

a first optical element and a second optical element for receiving and redirecting light from said first and second linear array of light sources, respectively, into collimated beams of light in a fast axis;

a prism comprising at least two mirrored sides, said prism suitably positioned to closely place together in parallel said collimated beams of light from said first and second optical element;

a third optical element optically aligned with said fist microlens arrays and said second microlens arrays, said second optical element for receiving light in the slow axis from said first microlens array and said second microlens array and for focusing light therefrom both onto said target area; and a fourth optical element optically aligned with said first and second optical elements, said fourth optical element for receiving light in the fast axis from said first and second optical elements and for focusing light therefrom onto said target area.

10. The optical system according to claim 9, wherein each said microlens is operative to refract light from one of said individual light sources into a collimated beam of light in the slow axis.

11. The optical system according to claim 9, wherein each said microlens is operative to diffract light from one of said individual light sources into a collimated beam of light in the slow axis.

12. The optical system according to claim 9, wherein each said microlens is operative to refract and diffract, in combination, light from one of said individual light sources into a collimated beam of light in the slow axis.

13. The optical system according to claim 9, wherein each said first and said second optical elements are operative to refract light from one of said individual light sources into a collimated beam of light in the fast axis.

14. The optical system according to claim 9, wherein each said first and said second optical elements are operative to diffract light from one of said individual light sources into a collimated beam of light in the fast axis.

15. The optical system according to claim 9, wherein each said first and said second optical elements are operative to refract and diffract, in combination, light from one of said individual light sources into a collimated beam of light in the fast axis.

16. The optical system according to claim 9, further comprising aberration means for broadening the light from said linear array of individual light sources in order to reduce the sensitivity of said optical system to individual light sources that are off axis, said aberration means placed in the fast axis of said optical system.

* * * * *